United States Patent
Ogiso et al.

(10) Patent No.: US 8,675,948 B2
(45) Date of Patent: Mar. 18, 2014

(54) MASK INSPECTION APPARATUS AND MASK INSPECTION METHOD

(75) Inventors: Yoshiaki Ogiso, Tokyo (JP); Tsutomu Murakawa, Tokyo (JP)

(73) Assignee: Advantest Corp., Tokyo (JP)

( * ) Notice: Subject to any disclaimer, the term of this patent is extended or adjusted under 35 U.S.C. 154(b) by 153 days.

(21) Appl. No.: 13/066,180

(22) Filed: Apr. 7, 2011

(65) Prior Publication Data

US 2011/0249108 A1    Oct. 13, 2011

(30) Foreign Application Priority Data

Apr. 12, 2010 (JP) ................. 2010-091556

(51) Int. Cl.
*G06K 9/00* (2006.01)

(52) U.S. Cl.
USPC .......... 382/144; 382/141; 382/148; 382/151; 348/79; 348/E07.085

(58) Field of Classification Search
USPC ................................ 382/141–152
See application file for complete search history.

(56) References Cited

U.S. PATENT DOCUMENTS

2006/0011837 A1* 1/2006 Jee et al. .......... 250/311
2010/0303334 A1* 12/2010 Kitamura et al. ........ 382/141

FOREIGN PATENT DOCUMENTS

| JP | 05-296754 | 11/1993 |
| JP | H06-337514 | 12/1994 |
| JP | 2007-292732 | 11/2007 |

OTHER PUBLICATIONS

Hakii et al. "An Evaluation of a New Side-wall-angle Measurement Technique for Mask Patterns by CD-SEM", Proc. of SPIE, vol. 7379, 737922, 2009.
Office action issued by Japanese Patent Office for the counterpart Japanese application and its English translation.

* cited by examiner

*Primary Examiner* — Ruiping Li
(74) *Attorney, Agent, or Firm* — Muramatsu & Associates (57) ABSTRACT

A mask inspection apparatus includes irradiation means for irradiating a sample with an electron beam, electron detection means for detecting a quantity of electrons generated from the sample having a pattern formed thereon by the irradiation with the electron beam, image processing means for generating image data of the pattern on the basis of the quantity of the electrons, and control means for creating a line profile and a differential profile of the pattern formed on the sample on the basis of the quantity of the electrons detected by the electron detection means. The control means detects a rising edge and a falling edge of the pattern on the basis of the differential profile, and then generates mask data of a multi-level structure on the basis of data of the edges and the image data created by the image processing means.

6 Claims, 6 Drawing Sheets

MASK INSPECTION APPARATUS AND MASK INSPECTION METHOD

CROSS-REFERENCE TO RELATED APPLICATIONS

This application is based upon and claims the benefits of priority of the prior Japanese Patent Application No. 2010-091556, filed on Apr. 12, 2010, the entire contents of which are incorporated herein by reference.

BACKGROUND OF THE INVENTION

1. Field of the Invention

The embodiment discussed herein is related to a mask inspection apparatus and a mask inspection method by which a two-level edge structure can be determined without CAD information.

2. Description of the Related Art

As a method of measuring line widths of patterns, there is the method using a scanning electron microscope. The method using the scanning electron microscope is performed by irradiating a sample with incident electrons while scanning the surface of the sample in an electron beam scanning region by the incident electrons, acquiring, secondary electrons emitted from the sample through a scintillator, converting the quantity of the acquired electrons into luminance, and then displaying images on a display.

When managing the characteristics of a semiconductor device by using such a scanning electron microscope, a generally employed operation is to inspect whether or not a pattern is formed to have a line width within a design standard. The following procedure is used to manage the line width of a pattern. The procedure follows a sequence of displaying a predetermined region of a pattern formed on a photomask on a display, aiming an electron beam at a measurement point within the displayed region and applying it onto the measurement point, and then, acquiring a luminance distribution waveform on the basis of secondary electrons reflected from the measurement point. Subsequently, the procedure follows a sequence of determining a width of a high level portion of the luminance distribution waveform to be the line width, determining whether or not this line width falls within a tolerance range, and then, moving to the next step if the line width falls within the tolerance range while returning to the pattern-formation processing step if the line width is out of the tolerance range.

Thus, the measurement of line widths of patterns is important in the manufacturing process of semiconductor devices. Thus, there are proposed various techniques to accurately measure the line widths.

In general, an edge position of a pattern is defined by a position of the largest gradient of luminance corresponding to the quantity of secondary electrons. In contrast, Japanese Laid-open Patent Publication No. 05-296754 discloses an edge detection method which considers a position of the local minimum value of a secondary electron signal as the edge position.

As described above, in a case where a scanning electron microscope is used to measure a line width of a pattern, there is employed the method in which an edge position is defined by a position of the largest gradient of luminance or the method in which an edge position is defined by a position of the local minimum value of a secondary electron signal.

In recent years, a progress in the miniaturization of semiconductor devices brings use of photomasks having a two-level edge structure such as a phase-shift mask. For the photomasks having such a structure, the scanning electron microscopes is also used to determine whether or not a photomask is accurately created by evaluating an SEM image of the photomask.

SEM images are created on the basis of luminance data. For photomasks having a two-layer structure, the luminance in a region with a pattern is different from the luminance in a region without any pattern. Thus, a pattern structure can be detected by use of the SEM images.

However, for photomasks having the two-level edge structure, the luminance value in a region with a pattern is not necessarily different from that in a region without any pattern. Thus, it is difficult to specify the layer structure of the photomask from contrast information of SEM images.

SUMMARY OF THE INVENTION

The present invention has an object to provide a mask inspection apparatus and a mask inspection method that are capable of precisely specifying steps in a measurement target region on a measurement target formed of a multi-level pattern on the basis of SEM images to accurately determine the structure of the steps.

The above problem is solved by a mask inspection apparatus including irradiation means for irradiating a sample with an electron beam, electron detection means for detecting a quantity of electrons generated from the sample by the irradiation with the electron beam, the sample having a pattern formed thereon, image processing means for generating image data of the pattern on the basis of the quantity of the electrons, and control means for creating a line profile and a differential profile of the pattern formed on the sample on the basis of the quantity of the electrons detected by the electron detection means. The control means detects a rising edge and a falling edge of the pattern detected on the basis of the differential profile, and then generates mask data of a multi-level structure on the basis of data of the edges and the image data generated by the image processing means.

In the mask inspection apparatus according to this aspect, the control means may detect a pair of a falling edge and a rising edge being opposed to each other on a same layer and then record the pair of the edges as edge data, and the control means may display a region between the falling edge and the rising edge being opposed to each other in a different form for each layer.

Moreover, the above problem is solved by a mask inspection method including the steps of acquiring an SEM image of a pattern formed on a sample, creating data for a two-layer structure on the basis of the SEM image, creating a line profile and a differential profile of the pattern, detecting a rising edge and a falling edge of the pattern from the differential profile, and generating mask data of a multi-level structure on the basis of data of the edges and image data generated by image processing means.

In the mask inspection method according to this aspect, the step of detecting a rising edge and a falling edge of the pattern may be a step of detecting a pair of a falling edge and a rising edge being opposed to each other on a same layer and recording the pair of the edges as edge data, or the method may further include a step of displaying a region between the falling edge and the rising edge being opposed to each other in a different form for each layer.

DESCRIPTION OF THE PREFERRED EMBODIMENT

An embodiment of the present invention will be described in detail with reference to the drawings.

First, the specification describes a configuration of a scanning electron microscope used as a pattern measurement apparatus. Next, it describes a method of measuring a line width of a pattern in general. Then, with respect to a tri-tone mask as a target, the specification describes a detection method of a mask having a layered structure.

(Configuration of Scanning Electron Microscope)

Figure 1:
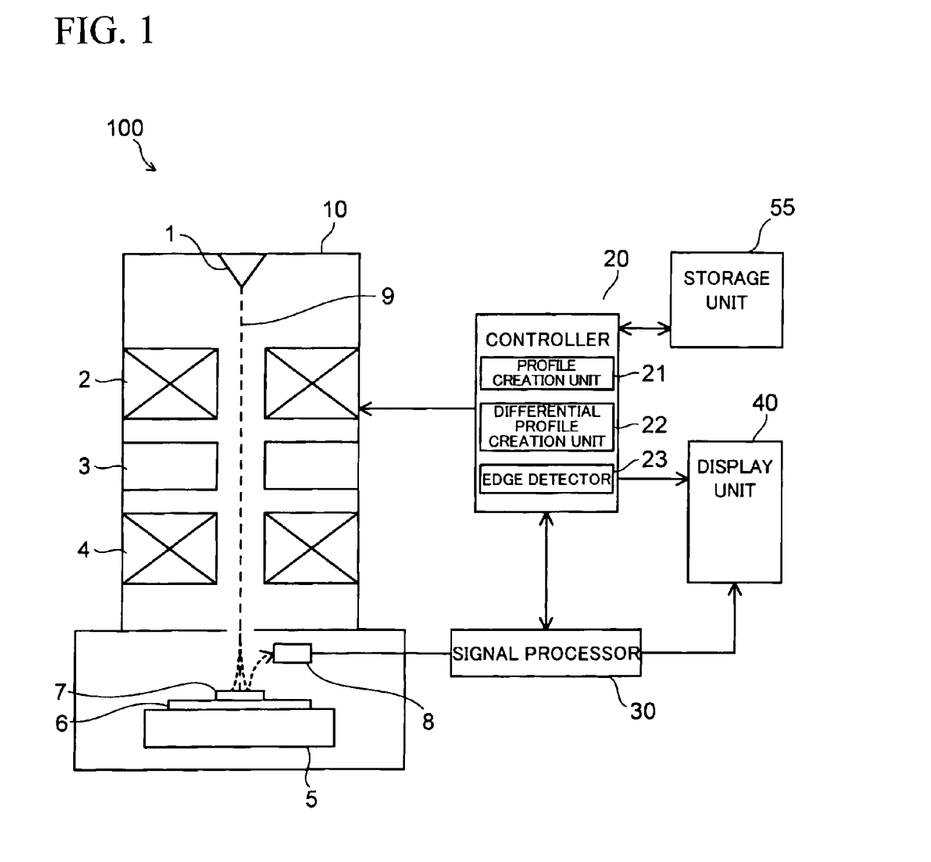
FIG. 1 is a configuration view of a scanning electron microscope used in an embodiment of the present invention.

FIG. 1 is a configuration view of a scanning electron microscope according to the embodiment.

The scanning electron microscope 100 mainly includes an electron scanning unit 10, a signal processor 30, an image display unit 40, a storage unit 55, and a control unit 20 configured to control each of the electron scanning unit 10, the signal processor 30, the image display unit 40 and the storage unit 55. The control unit 20 has a profile creation unit 21, a differential profile creation unit 22 and an edge detector 23.

The electron scanning unit 10 has an electron gun 1, a condenser lens 2, a deflection coil 3, an objective lens 4, a movable stage 5 and a sample holder 6.

A sample 7 on the movable stage 5 is irradiated with charged particles 9 through the condenser lens 2, the deflection coil 3 and the objective lens 4. Here, the charged particles 9 are emitted from the electron gun 1.

Secondary electrons emitted from the sample 7 by the irradiation with the charged particles 9 are detected by an electron detector 8 configured of a scintillator or the like. The quantity of the secondary electrons thus detected is converted into a digital quantity by an AD converter of the signal processor 30 and then stored in the storage unit 55 as image data. The image data is converted into luminance signals and then displayed on the image display unit 40. Note that the image data includes information such as a range of the acquired image, the magnification of the SEM, and the like. The control unit 20 controls the electron-deflection amount of the deflection coil 3 and the image-scanning amount of the image display unit 40. In addition, the control unit 20 stores therein a program for executing line width measurement.

The profile creation unit 21 creates line profiles representing luminance signals of SEM image data in a specified region. Each line profile indicates a luminance signal corresponding to the quantity of the secondary electrons and is considered to reflect a cross-sectional shape of a measurement pattern.

The differential profile creation unit 22 performs first differentiation processing and second differentiation processing on the line profile to create a first differential profile and a second differential profile.

The edge detector 23 detects edges of the pattern from the line profile, the first differential profile and the second differential profile.

(Measurement of Pattern Size Using SEM Image In General)

Next, a description is given about measurement of a pattern size utilizing an SEM image while using the scanning electron microscope 100 illustrated in FIG. 1. Note that the measurement includes edge detection of a pattern on a sample illustrated in FIG. 2A.

Figure 2A:
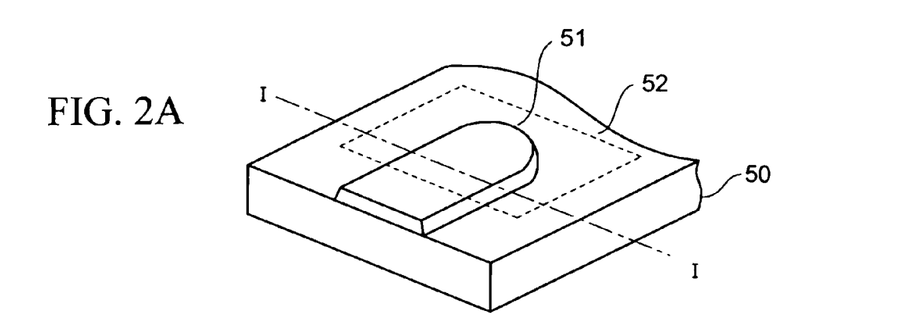
FIGS. 2A to 2D are views for describing an electron image and profiles acquired by a signal processor.

On the sample 7 as the target, a wiring pattern 51 is formed on a photomask substrate 50 as illustrated in FIG. 2A. A part of the sample 7 has a planer surface as illustrated in FIG. 2A. Note that the portion surrounded by a broken line 52 indicates an observed area of the scanning electron microscope 100.

Figure 2B:
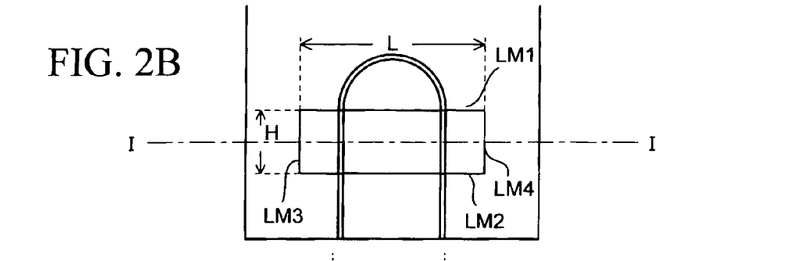

FIG. 2B illustrates an example of an SEM image. The SEM image is acquired by scanning the sample illustrated in FIG. 2A with the electron beam, detecting the quantity of secondary electrons and the like from the sample by the electron detector 8, converting the detected quantity of the electrons into luminance signals, and then displaying the luminance signals while synchronizing electron beam scanning with scanning of the display (display unit 40).

A length measurement area is specified on the SEM image illustrated in FIG. 2B, and a corresponding SEM image is extracted therefrom. The length measurement area is set to be an area having a width H equal to 400 pixels and a length L, for example. The operator selects this area by an upper line marker LM1, a lower line marker LM2, a left line marker LM3 and a right line marker LM4.

Pixel data of the extracted SEM image are divided into areas with respect to the direction H of the length measurement area, and a line profile corresponding to luminance distribution is found for each of the divided areas. Note that, when the line profile is to be found, it is possible to reduce noise components by performing smoothing processing in the length L direction with a three-pixel width, for example.

Figure 2C:
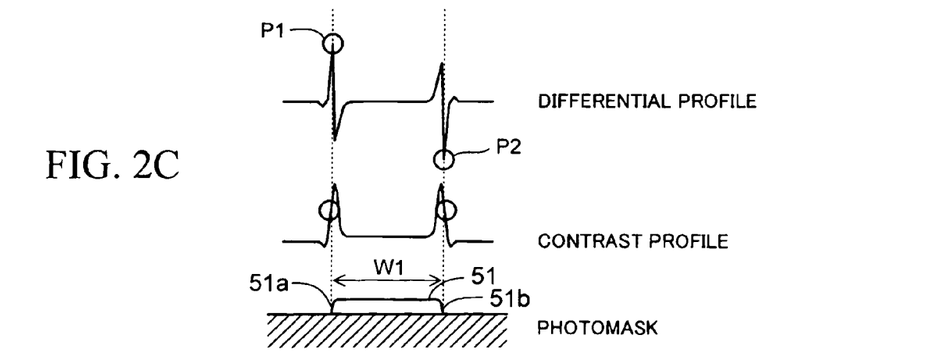

FIG. 2C is a view illustrating a line profile corresponding to the quantity of the secondary electrons emitted from the sample, which can be acquired upon irradiation with an electron beam along the I-I line of FIG. 2A. As illustrated in FIG. 2C, the line profile (contrast profile) drastically changes at the edge portions of the pattern. In order to find the position where the profile drastically changes, the line profile is differentiated to find the maximum peak and the minimum peak of the amount of differential signal.

Figure 2D:
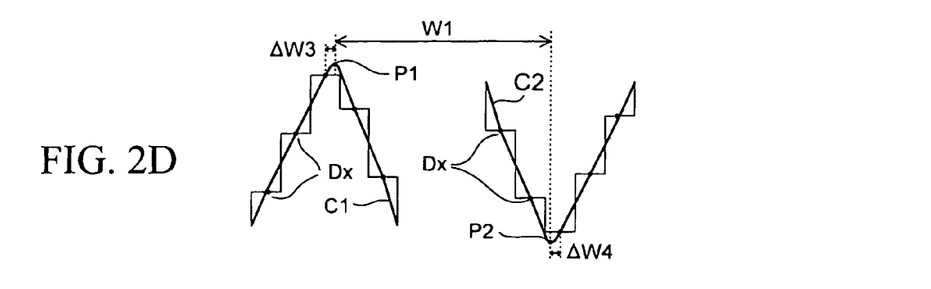

Furthermore, as illustrated in FIG. 2D, differential waveforms C1 and C2 are found by pixel interpolation based on a plurality of differential signals Dx around peaks. Then, the peak positions of a first peak P1 and a second peak P2 are calculated with 1/100 resolution. A line width W1 of the line pattern is found as a distance between the first peak P1 and the second peak P2.

The aforementioned processing is performed for each of the divided areas. Then, the average value of the widths of the pattern calculated for the respective areas is defined as a length measurement value. In this manner, a more accurate width W1 of the line pattern can be found.

(Determination of Multi-level Structure Mask by SEM Image)

Hereinafter, a description is given of processing to simply and correctly determine a structure of a mask having a multi-level pattern formed on a glass substrate as a tri-tone mask.

Figure 3:
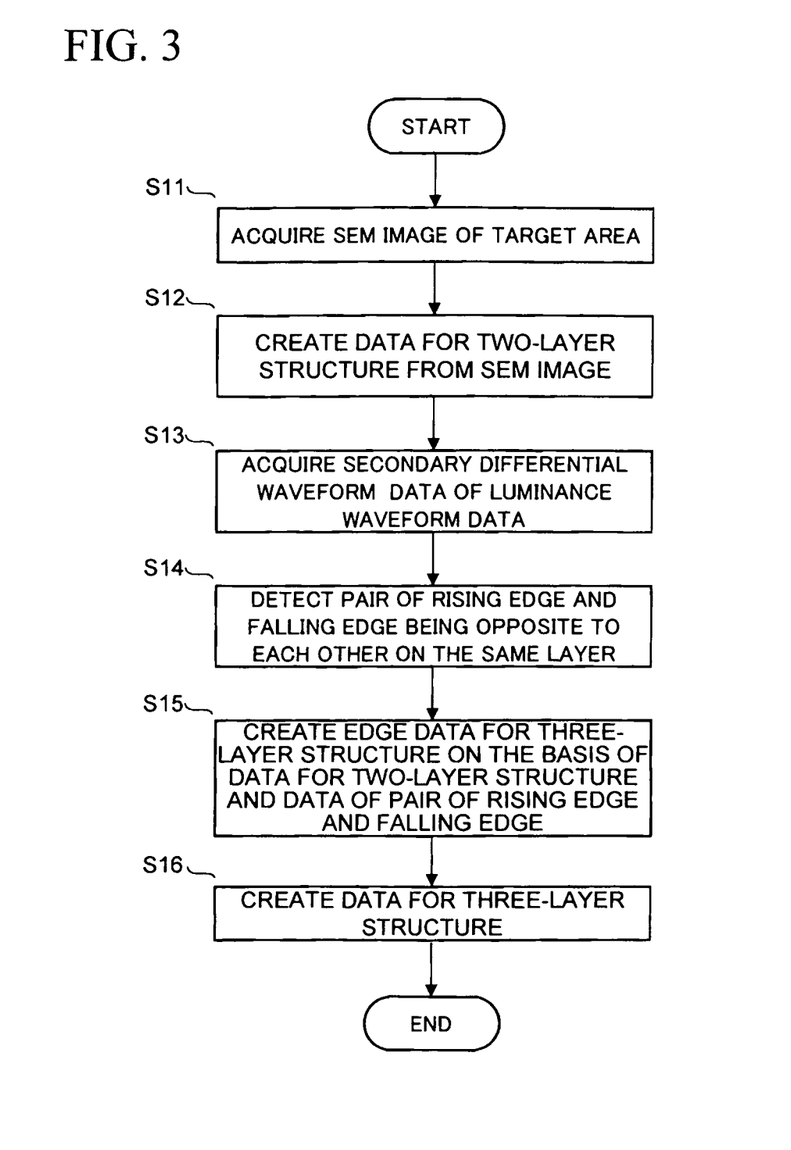
FIG. 3 is a flowchart illustrating an example of data acquisition processing for a three-layer structure mask.

FIG. 3 is a flowchart illustrating an example of the processing to acquire data of a multilayered structure. FIGS. 4A to 6C are views for describing this processing. Here, it is assumed that this processing is preceded by acquiring an SEM image of a sample on which a pattern is formed and then storing SEM image data in the storage unit 55.

Figure 4A:
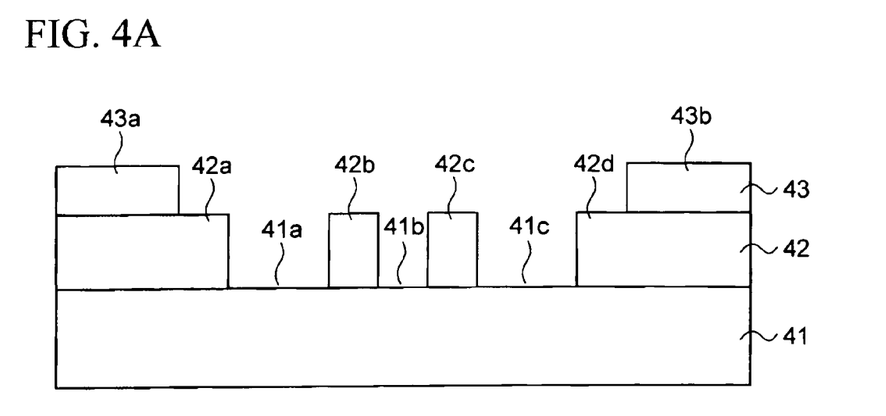
FIGS. 4A and 4B are views illustrating an example of the three-layer structure mask and an SEM image thereof.

In this embodiment, a target is a ternary mask illustrated in FIG. 4A. As illustrated in FIG. 4A, the tri-tone mask (Ternary mask) includes a light semi-transmissive phase-shift film made of a Mo.Si based or zirconium silicide based material, which is formed on a transparent glass substrate made of quartz, and a light shielding film made of a metal material such as Cr (chrome), which is formed on the light semi-transmissive phase-shift film. The glass substrate 41, the light semi-transmissive phase-shift film 42 and the light shielding film 43 are referred to as first, second and third layers, respectively.

No chrome of the third layer exists on patterns 42b and 42c of the second layer, while chrome patterns 43a and 43b are formed partially on patterns 42a and 42d of the second layer, respectively.

Figure 4B:
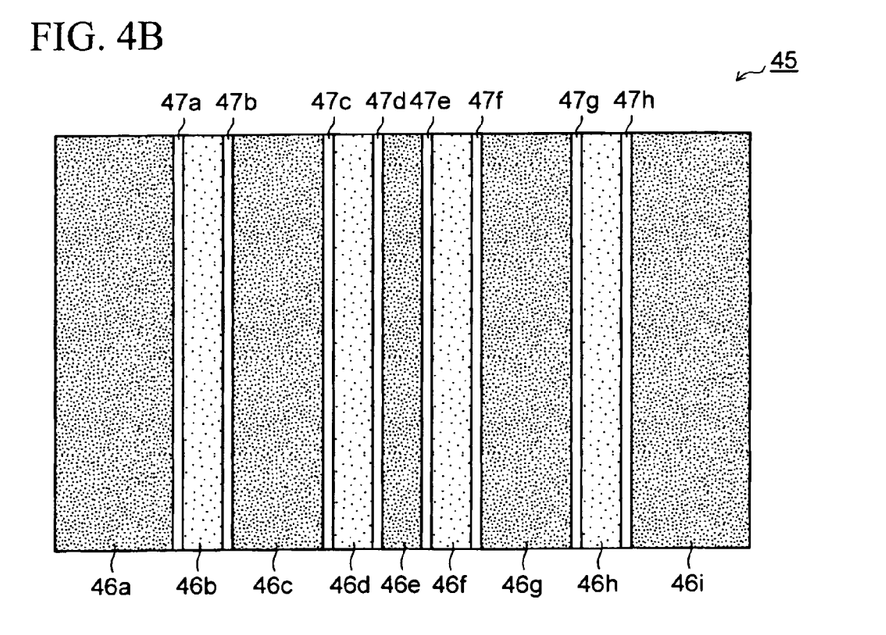

In step S11 of FIG. 3, an SEM image in a target area is acquired. A desired inspection area is specified to extract SEM image data from the storage unit 55. FIG. 4B illustrates an example of the SEM image acquired by scanning the tri-tone mask of FIG. 4A while irradiating the tri-tone mask with an electron beam. As illustrated in FIG. 4B, SEM images 46c, 46e and 46g corresponding to no pattern areas 41a, 41b and 41c have low luminance and thus they are displayed in black. On the other hand, SEM images 46d and 46f corresponding to pattern forming areas 42b and 42c have high luminance and thus they are displayed in almost white. In addition, for pattern forming areas 42a and 42d as the second layer, SEM images 46b and 46h corresponding to the areas 42a and 42d except for pattern forming areas 43a and 43b as the third layer are displayed in almost white. On the other hand, SEM images 46a and 46i corresponding to pattern forming areas 43a and 43b as the third layer are displayed in black.

Figure 6A:
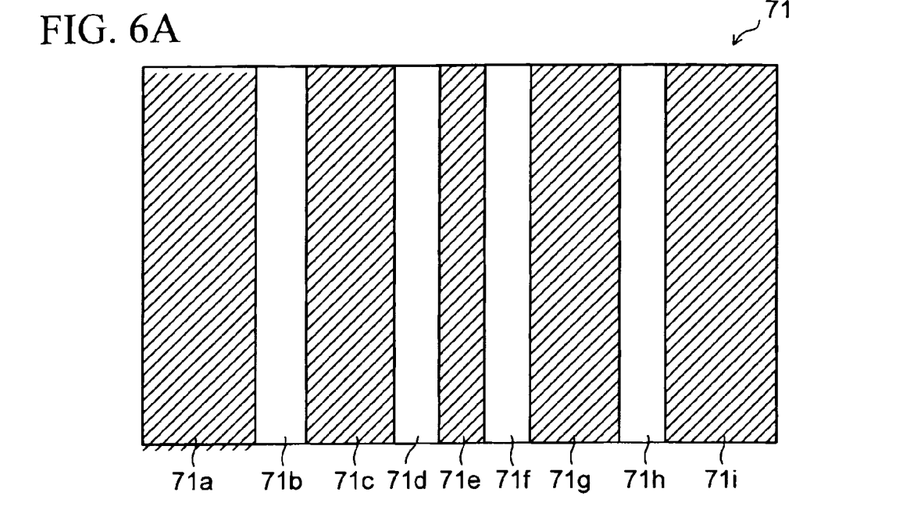
FIGS. 6A to 6C are examples of views created on the basis of acquired data of the three-layer structure mask.

Subsequently, in step S12, data for a two-layer structure is created on the basis of the SEM images acquired in step S11. As illustrated in the SEM images of FIG. 4B, it is impossible to determine that the mask has a three-layer structure from the SEM images. Thus, image data to distinguish between the pattern forming area and the no pattern area in the case of a two-layer structure is first generated on the basis of the tones of the images. FIG. 6A is a view illustrating an example of the image data.

Next, in step S13, secondary differentiation waveform data of luminance waveform data (line profile) is acquired.

The area set as the measurement target is extracted among the SEM images stored in the storage unit 55. Then, luminance information is extracted from the SEM image data to create a line profile. In the differential profile creation unit 22, this profile is subjected to the secondary differentiation processing.

Figure 5:
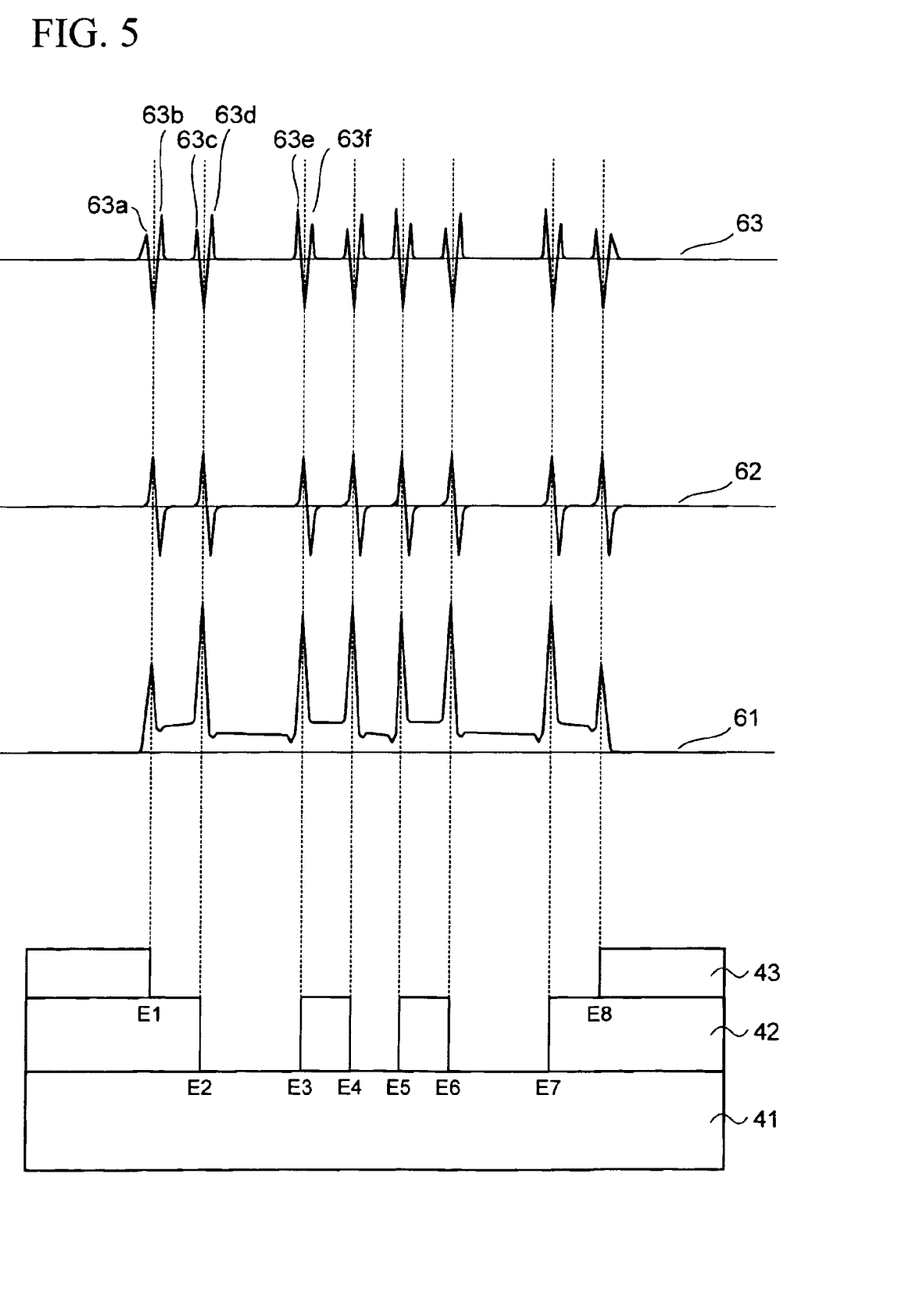
FIG. 5 is a view for describing profiles of the three-layer structure mask.

FIG. 5 illustrates a line profile 61 representing a luminance signal acquired from the SEM images of the tri-tone mask. In addition, FIG. 5 illustrates a first differential profile 62 and a second differential profile 63 obtained by subjecting the line profile 61 to the first differentiation processing and the second differentiation processing.

As illustrated in the line profile 61 of FIG. 5, the amount of signal of the line profile 61 is large at each edge portion (E1 to E8) of the patterns. In addition, the amount of signal of the first layer, the amount of signal of the second layer and the amount of signal of the third layer are different from one another. In the case illustrated in FIG. 5, the amount of signal of the first layer is smallest and the amount of signal of the second layer is largest.

In general, the position where the gradient is sharpest in the line profile is determined as an edge of the pattern. In order to find the position where the gradient is sharpest, the line profile is subjected to the first differentiation processing to find the local maximum value and the local minimum value of thereby creating the first differential profile 62.

As can be seen from the first differential profile 62 of FIG. 5, the extreme values exist at the positions corresponding to a boundary E1 between the patterns 43a and 42a, a boundary E2 between the patterns 42a and the space 41a, and the like. These extreme values indicate the boundaries between the patterns, the boundaries between the patterns and spaces, i.e., edge positions. In this manner, the edge positions are found by calculating the positions of the local maximum values and the local minimum values of the first differential profile 62.

On the basis of the data of the second differential profile 63 of FIG. 5, rising and falling of the edge is determined. In the second differential profile 63, two peaks having different intensity values appear near the position corresponding to each edge of the pattern. On the basis of the positions (row positions) where the two peaks having different amounts of the signal appear, whether the edge is rising or falling is determined.

The edge of the pattern is determined to be rising if P1>P2, or to be falling if P1<P2, where P1 is a peak value at a peak position X1 and P2 is a peak value at a peak position X2 (>X1) at the two peak positions of the secondary differentiation profile appearing near the edge position.

In the second differential profile 63, for example, peak values 63a and 63b appear at positions corresponding to the edge E1, and the peak value 63b on the right side has an amount of signal larger than the peak value 63a. In this case, the corresponding edge E1 is determined to be a falling edge.

Likewise, peak values 63c and 63d appear at positions corresponding to the edge E2, and the peak value 63d on the right side has an amount of signal larger than the peak value 63c. In this case, the edge E2 is also determined to be a falling edge.

In contrast, peak values 63e and 63f appear at positions corresponding to the edge E3, and the peak value 63f on the right side has an amount of signal smaller than the peak value 63e. In this case, the edge E3 is determined to be a rising edge.

Similarly, for every edge, whether the edge is a rising edge or a falling edge is determined on the basis of the second differential profile corresponding to the edge.

In step S14 of FIG. 3, a pair of a rising edge and a falling edge being opposed to each other on the same layer is detected on the basis of the secondary differentiation waveform data acquired in step S13.

According to the result of the second differentiation processing, two peak positions appearing near each edge position and the peak values of the peak positions are recorded. These values are stored in the storage unit 55 in association with the edge position. On the basis of the result of the second differential profile of FIG. 5, the edges E1, E2, E4 and E6 are determined to be falling edges, while the edges E3, E5, E7 and E8 are determined to be rising edges.

Figure 6B:
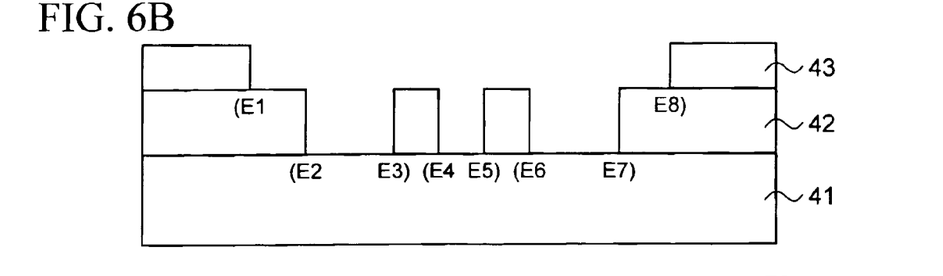

Among the detected rising edges and falling edges, a rising edge and a falling edge being opposed to each other on the same layer are recorded as a pair. For example, according to the result of the second differential profile of FIG. 5, the edges E2 and E3, the edges E4 and E5 and the edges E6 and E7 are the edge pairs on the second layer as illustrated in FIG. 6B. In addition, the edges E1 and E8 are the edge pair on the third layer.

Note that, the edge positions are acquired by subjecting the line profile to the first differentiation processing, then detecting the positions taking the maximum values and the minimum values of the amounts of signal, and then recording the positions. The differential profile creation unit 22 performs the first differentiation processing by using a differential filter such as a Sobel filter used in general image processing, for example.

Next, in step S15, edge data for a three-layer structure is created on the basis of the data for the two-layer structure created in step S12 and the data of the edge pairs of the falling edges and the rising edges. Then, the data for the three-layer structure is displayed in step S16.

An image as illustrated in FIG. 6A is generated on the basis of the data for the two-layer structure. In this image, the areas between the falling edge and the rising edge on the second layer correspond to the surface of the first layer, and have luminance lower than the pattern forming areas in general and are displayed with oblique lines. The image data for the edge pairs of the falling edge and the rising edge on the second layer is kept unchanged.

Meanwhile, the area between the falling edge and the rising edge on the third layer (the edge E1 and the edge E8 of FIG. 6B) is considered as no pattern area in a case where the second layer is considered as the substrate. Thus, image data corresponding to the no pattern area is generated in a form different from that of the image created for the edge pairs on the second layer (the area is displayed by oblique lines in a reverse direction to the aforementioned oblique lines (hereinafter, referred to as reversal oblique lines) in the drawing).

Figure 6C:
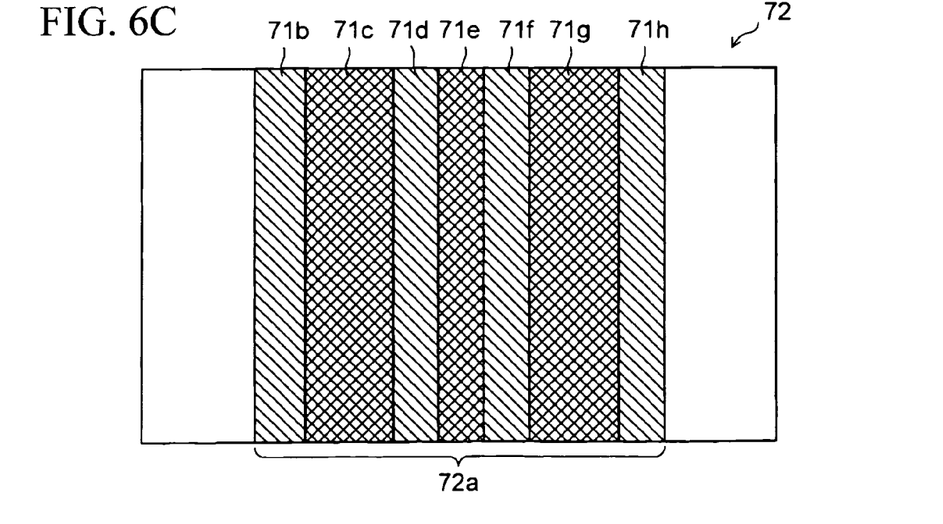

These images are overlapped to generate an image illustrated in FIG. 6C. In this image, an area 72a is no pattern area in the third layer, and areas 71c, 71e and 71g are no pattern areas in the second layer. In other words, it can be seen that the areas 71c, 71e and 71g displayed by the oblique lines and the reversal oblique lines overlapping each other are no pattern areas on the first layer. In addition, it can be seen that areas 71b, 71d, 71f and 71h displayed by only the reversal oblique lines are the areas where the pattern of the second layer exists. In this manner, the image is displayed so as to see the pattern to be in a two-level structure.

As described above, in the mask inspection apparatus and the mask inspection method of the embodiment, data for a two-layer structure is generated from SEM images for a mask having a multi-level structure, and then, data of rising edges and falling edges is generated from a differential profile of a pattern. Then, multi-level structure data of the pattern is created on the basis of the aforementioned data. In this way, a mask having a multi-level structure can be correctly determined without CAD data information, and thus, correct measurement can be performed.

In addition, in this embodiment, since the rising edges and the falling edges are identifiable, pattern measurement can be fully automated.

Moreover, in the embodiment, the description is given of a case where an electron beam is used as a charged particle beam for irradiation of a sample. However, the present invention is not limited to this case and can be applied to an apparatus using an ion beam, for example.

What is claimed is:

1. A mask inspection apparatus comprising:
irradiation means for irradiating a sample with an electron beam;
electron detection means for detecting a quantity of electrons generated from the sample having a pattern formed thereon by the irradiation with the electron beam;
image processing means for generating image data of the pattern on the basis of the quantity of the electrons; and
control means for creating a line profile, a first differential profile and a second differential profile of the pattern formed on the sample on the basis of the quantity of the electrons detected by the electron detection means, where the line profile is created based on the image data of the pattern, the first differential profile is created via a first differentiation processing on the line profile, and the second differential is created via second differentiation processing on the line profile;
wherein the control means detects an edge position on the basis of the first differential profile, determines rising and falling of the edge on the basis of two peaks appearing near the edge position of the second differential profile, and then generates mask data of a multi-level structure on the basis of data of the edges and the image data created by the image processing means, and
wherein the controller determines the edge of the pattern to be rising if P1>P2, or to be falling if P1<P2, where P1 is a peak value at a peak position X1 and P2 is a peak value at a peak position X2 (>X1) at the two peak position of the second differential profile appearing near the edge position.

2. The mask inspection apparatus according to claim 1, wherein the control means detects a pair of a falling edge and a rising edge being opposite to each other on a same layer and then records the pair of the edges as edge data.

3. The mask inspection apparatus according to claim 2, wherein the control means displays' an area between the falling edge and the rising edge being opposite to each other in a different form for each layer.

4. A mask inspection method comprising the steps of:
acquiring an SEM image of a pattern formed on a sample;
creating data for a two-layer structure on the basis of the SEM image;
creating a line profile of the pattern based on the data created from the SEM images, a first differential profile and a second differential profile of the pattern via first and second differentiation processing, respectively, of the line profile;
detecting an edge position of the pattern from the first differential profile;
determining rising and falling of the edge on the basis of two peaks appearing near the edge position of the second differential profile; and
generating mask data of a multi-level structure on the basis of data of the edges and image data created by image processing means;
wherein the edge of the pattern is determined to be rising if P1>P2, or to be falling if P1<P2, where P1 is a peak value at a peak position X1 and P2 is a peak value at a peak position X2 (>X1) at the two peak position of the second differential profile appearing near the edge position.

5. The mask inspection method according to claim 4, wherein the step of detecting a rising edge and a falling edge of the pattern is a step of detecting a pair of a falling edge and a rising edge being opposite to each other on a same layer and recording the pair of the edges as edge data.

6. The mask inspection method according to claim 4, further comprising a step of displaying an area between the falling edge and the rising edge being opposite to each other in a different form for each layer.

* * * * *